(12) United States Patent
Chan

(10) Patent No.: US 7,746,721 B2
(45) Date of Patent: Jun. 29, 2010

(54) WORD LINE DRIVER CIRCUIT

(75) Inventor: Jen-Chin Chan, Hsinchu County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 197 days.

(21) Appl. No.: 12/177,885

(22) Filed: Jul. 23, 2008

(65) Prior Publication Data

US 2010/0020629 A1 Jan. 28, 2010

(51) Int. Cl.
*G11C 8/00* (2006.01)
(52) U.S. Cl. .................. 365/230.06; 365/230.03
(58) Field of Classification Search ........... 365/230.06, 365/230.03
See application file for complete search history.

(56) References Cited

U.S. PATENT DOCUMENTS

| | | | |
|---|---|---|---|
| 5,815,458 A * | 9/1998 | Chevallier et al. ...... 365/230.06 |
| 5,848,021 A * | 12/1998 | Sugibayashi ........... 365/230.06 |
| 5,889,712 A * | 3/1999 | Sugibayashi ................ 365/200 |
| 6,388,472 B1 | 5/2002 | Kang | |
| 6,930,923 B2 | 8/2005 | Chen et al. | |
| 2006/0077717 A1 | 4/2006 | Park et al. | |

* cited by examiner

*Primary Examiner*—Vu A Le
(74) *Attorney, Agent, or Firm*—Jianq Chyun IP Office

(57) ABSTRACT

A sector of a word line driver circuit is provided, comprising a local reset signal generator module and m word line clusters. The m word line clusters are coupled to the local reset signal generator module. The local reset signal generator module is used to generate j reset signals. The x-th reset signal is determined according to an x-th pre-decoding signal, a bank selectable signal and a sector selectable signal, wherein j is a nature number, and x is an integer from 1 to j. Each of the m word line clusters comprises j row drivers. The x-th row driver of the y-th word line cluster determines a [x+j*(y−1)]-th word line signal according to the x-th reset signal, the x-th pre-decoding signal, the sector selectable signal, and a y-th cluster select signal, wherein m is a nature number, and y is an integer from 1 to m.

16 Claims, 12 Drawing Sheets

40

|  | Selected Word Line Cluster | | Unselected Word Line Cluster |
| --- | --- | --- | --- |
|  | Selected Word Line | Unselected Word Line | Unselected Word Line |
| VX | VPX | 0 | VPX or 0 |
| WLPUN | 0 | 0 | VPX |
| WLRST | 0 | VCC | 0 or VCC |
| WL | VPX | 0 | 0 |
| VNEG_S | 0 | 0 | 0 |
| VNX | VCC | VCC | VCC |

FIG. 6B

|  | Selected Sector | | Unselected Sector |
| --- | --- | --- | --- |
|  | Selected Word Line | Unselected Word Line | Unselected Word Line |
| VX | 0 | - | VCC |
| WLPUN | 0 | - | VCC |
| WLRST | VNEG | - | Float |
| WL | VNEG | - | 0 |
| VNEG_S | VNEG | - | 0 |
| VNX | 0 | - | 0 |

FIG. 7B

|  | Selected Word Line Cluster | | Unselected Word Line Cluster | |
|---|---|---|---|---|
|  | Selected Word Line | Unselected Word Line | Selected Word Line | Unselected Word Line |
| VX | VPX | | VPX or 0 | |
| WLPUN | 0 | 0 | VPX | |
| WLRST | 0 or −0.4 | VCC | 0, −0.4 or VCC | |
| WL | VPX | 0 or −0.4 | 0 or −0.4 | |
| VNEG_S | 0 or −0.4 | VCC | 0 or −0.4 | |
| VNX | VCC | VCC | VCC | |

FIG. 8B

WORD LINE DRIVER CIRCUIT

BACKGROUND OF THE INVENTION

1. Field of Invention

The present invention generally relates to the memory device, and more particularly to the word line driver circuit of the memory device.

2. Description of Prior Art

The memory device has a plurality of memory cells. When there are a plurality of data being to be stored (or read), the memory device must receive the word line selected signal of each of the data, so as to store the plurality of the data in the corresponding memory cells (or read the plurality of the data from the corresponding memory cells) according to the word line selected signals. Accordingly, the word line driver circuit is adapted in the memory device to generate the word line selected signals.

Referring to U.S. Pat. No. 6,388,472 B1 disclosed by Kang, Kang provided a word line driver circuit to generate the voltage of the decoder signal on the selected word line when the global word line is selected. On the other hands, the selected word line is pulled down to the ground when the global word line is not selected.

Referring to FIG. 1, FIG. 1 is a circuit diagram showing one sector 10 of the word line driver circuit provided by Kang.

When the sector 10 of the word line driver circuit is selected (i.e. the global line signal GWL is low) in the reading or programming procedure, the voltage of the word line signal WL0 is equal to that of the decoder signal VXPRE0 approximately. When the sector 10 of the word line driver circuit is unselected (i.e. the global line signal GWL is high) in the reading or programming procedure, the voltage of the word line signal WL0 is equal to that of the power supply VEEX approximately. In general, the power supply VEEX is ground terminal, and thus the voltage of the word line signal WL0 is pulled down the ground when the sector 10 of the word line driver circuit is unselected.

It is noted that, the inversed global line signal GWLb serves as a reset signal to control the row driver 12~15. In the memory device, there are many sectors of the word line decoder inside, and the inversed global line signal GWLb is coupled to each sector of the word line decoder. Since there are many sectors inside, the loading for the inversed global line signal GWLb may increase. Thus in order to drive the NMOS transistors of all sectors inside, the driving capability of the inversed global line signal GWLb must be strong. However the power consumption increases when increasing the driving capability of the inversed global line signal GWLb. Although laying a wires to provide the inversed global line signal GWLb to all sectors does not make the die area efficiency poor in the 0.25 or 0.16 micron meter semiconductor process, laying a wires to provide the inversed global line signal GWLb to all sectors will make the die area efficiency poor the 90 nano-meter semiconductor process.

Referring to U.S. Pub. No. 2006/0077717 A1 disclosed by Park et al., Park et al. provided a word line driver circuit to generate the voltage. Please see FIG. 2, FIG. 2 is a circuit diagram showing one sector 100 of the word line driver circuit provided by Park et al. The sector 100 of the word line driver circuit includes a word line decoder 109 and a plurality of row drivers DRV0~DRVi.

When the sector 100 of the word line driver circuit is selected (i.e. the global line signal GWL_1 and the sector selection signal SS are high) in the reading or programming procedure, the power supplies Vpx and Vpgate are high and the power supply Vexen is low. Now the node ND10 is low and the word line signal WL<k> is controlled by the decoder signals PWL<k> and nPWL<k>, wherein the nPWL<k> is the inversion of the decoder signal PWL<k>, and k is an integer from 1 to i. While sector 100 of the word line driver circuit is unselected (i.e. the global line signal GWL_1 and the sector selection signal SS are low) in the reading or programming procedure, the power supplies Vpx and Vexen are high and the power supply Vpgate is low. Now the node ND10 is high and the word line signal WL<k> is pulled down to the ground Vex.

It is noted that, the global line signal GWL_1 serves as a reset signal to control the row driver DRV0~DRVi, and the power supply Vpx is used to control the NMOS transistors of the row driver DRV0~DRVi, so as to pull down the word line signal WL<k>. As stated above, in the memory device, there are many sectors of the word line decoder inside. The power supply Vpx is coupled to the gates of the NMOS transistors of all sectors. Since there are many sectors inside, the loading for the power supply Vpx may increase. In order to drive the NMOS transistors of all sectors inside, the driving capability of the power supply Vpx must be strong. Thus the power efficiency is low. Furthermore, the problem of laying a long wire in 90 nano-meter process will occur as stated above, so the die area efficiency is still poor.

Referring to U.S. Pat. No. 6,930,923 B2 disclosed by Chen et al., Chen et al. provided a word line driver circuit to generate the voltage. Please see FIG. 3, FIG. 3 is a circuit diagram showing one sector 72a of the word line driver circuit provided by Chen et al. The sector 72a of the word line driver circuit includes a word line decoder 82a and a plurality of row drivers 83a~83c.

When the sector 72a is unselected in the reading or programming procedure, the output of the NAND gate 84 is high, and the transistors 86b, 86d and 86e turn on. Now the voltage of node A is high, the voltage of the node B is low, and the reset signal $(Vrst)_i$ is high, wherein i is an integer from 1 to 7. Thus the voltage of the word line signal $WL_i$ is pulled down to the ground (i.e. the power supply Vin' is low with zero voltage).

As stated above, in the memory device, there are many sectors of the word line decoder inside. The reset signal $(Vrst)_i$ is coupled to the gates of the NMOS transistors of all sectors. Since there are many sectors inside, the loading for the reset signal $(Vrst)_i$ i may increase. In order to drive the NMOS transistors of all sectors inside, the driving capability of the reset signal $(Vrst)_i$ i must be strong. Thus the power efficiency is low. Furthermore, the problem of laying a long wire in 90 nano-meter process will occur as stated above, so the die area efficiency is still poor.

SUMMARY OF THE INVENTION

Accordingly, the present invention is directed to a word line driver circuit.

The present invention provides a sector of a word line driver circuit, and the sector of a word line driver circuit comprises a local reset signal generator module and m word line clusters. The m word line clusters are coupled to the local reset signal generator module. The local reset signal generator module is used to generate j reset signals. The x-th reset signal is determined according to an x-th bank select signal, a bank selectable signal and a sector selectable signal, wherein j is a nature number, and x is an integer from 1 to j. Each of the m word line clusters comprises j row drivers. The x-th row driver of the y-th word line cluster determines a [x+j*(y−1)]-th word line signal according to the x-th reset signal, the x-th bank select signal, the sector selectable signal, and a y-th cluster select signal, wherein m is a nature number, and y is an integer from 1 to m.

The word line driver circuit provided by the embodiment of the present invention has a local reset signal generator module for each sector, thus the power efficiency performs better than the conventional word line driver circuit. While manufacturing the word line driver circuit provided by the embodiment of the present invention in 90 nano-meter process, utilizing the die area of each sector to dispose the local reset signal generator module in each sector will make the die area efficiency higher than that of the conventional word line driver circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6B is a table showing a general relation of the signals when the sector 40-1 of the word line driver circuit 40 operates in Program-or-Read mode.

FIG. 7B is a table showing a general relation of the signals when the word line driver circuit 40 operates in Erase mode.

FIG. 8B is a table showing a general relation of the signals when the sector 40-1 of the word line driver circuit 40 operates in Erase-Verify mode.

DESCRIPTION OF THE EMBODIMENTS

Figure 1:
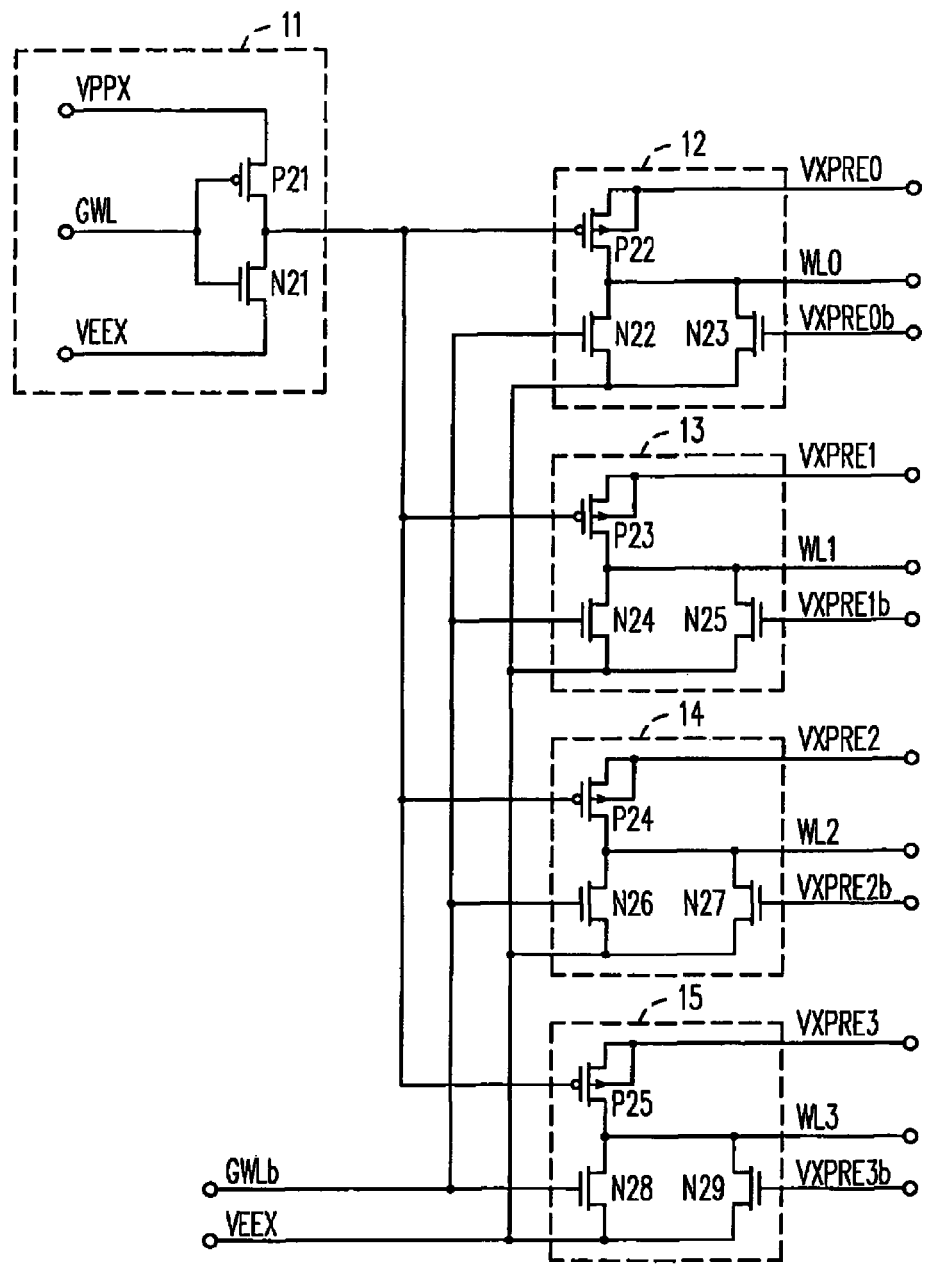
FIG. 1 is a circuit diagram showing one sector 10 of the word line driver circuit provided by Kang.
Figure 2:
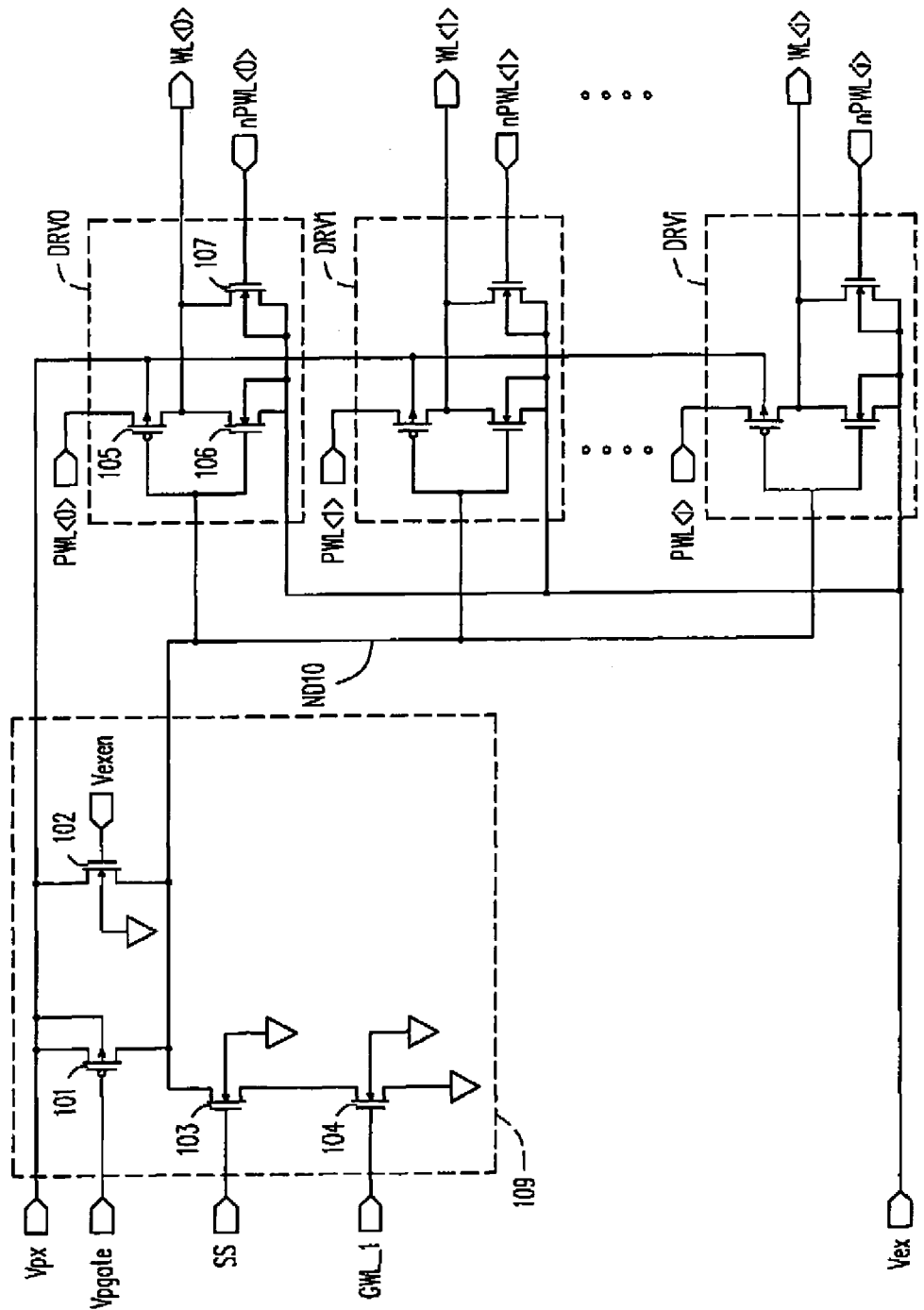
FIG. 2 is a circuit diagram showing one sector 100 of the word line driver circuit provided by Park et al.
Figure 3:
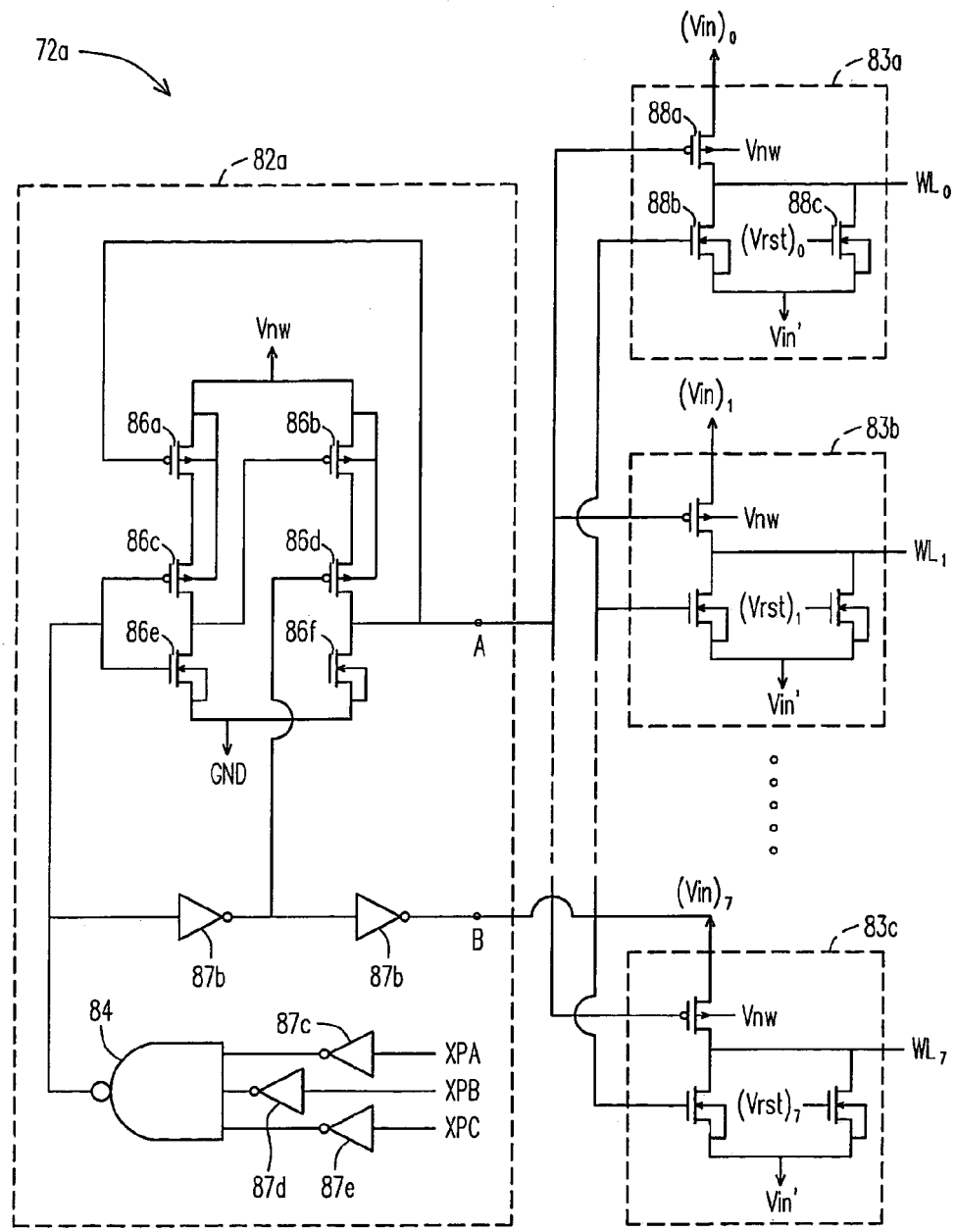
FIG. 3 is a circuit diagram showing one sector 72a of the word line driver circuit provided by Chen et al.

Reference will now be made in detail to the present preferred embodiment of the invention, examples of which are illustrated in the accompanying drawings. Wherever possible, the same reference numbers are used in the drawings and the description to refer to the same or like parts.

Figure 4A:
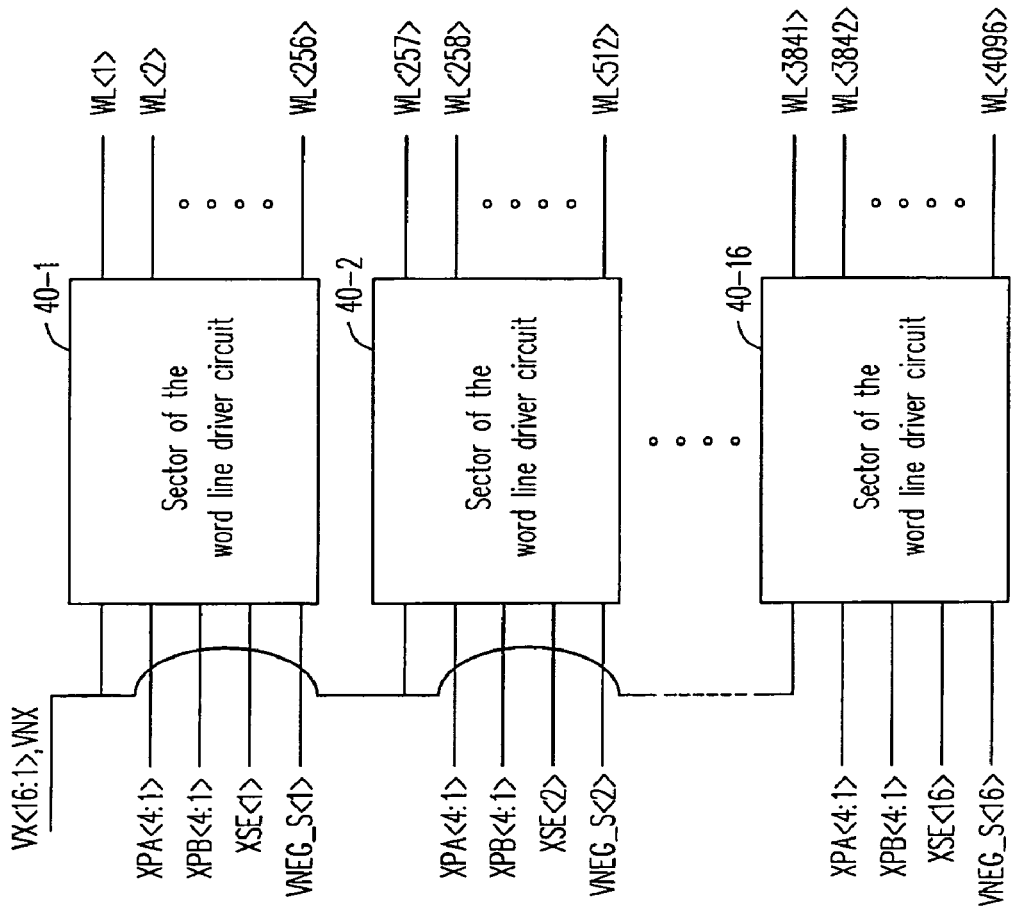
FIG. 4A is a block diagram showing a word line driver circuit 40 according to an embodiment of the present invention.

Referring to FIG. 4A, FIG. 4A is a block diagram showing a word line driver circuit 40 according to an embodiment of the present invention. The word line driver circuit 40 comprises 16 sectors 40-1, 40-2, . . . , 40-16 of the word line driver circuit 40, but the number of the sectors 40-1, 40-2, . . . , 40-16 of the word line driver circuit 40 does not intend to limit the scoped of the present invention. The sector 40-$k$ of the word line driver circuit 40 determines 256 word line signals WL<256*(k−1)+1:256*k> according to a plurality of pre-decoding signals XPA<4:1>, XPB<4:1>, a k-th sector select signal XSE<k>, a sector selectable signal VNEG_S<k>, a plurality of pre-decoding signals VX<16:1>, and a bank selectable signal VNX, wherein k is an integer from 1 to 16.

Figure 4B:
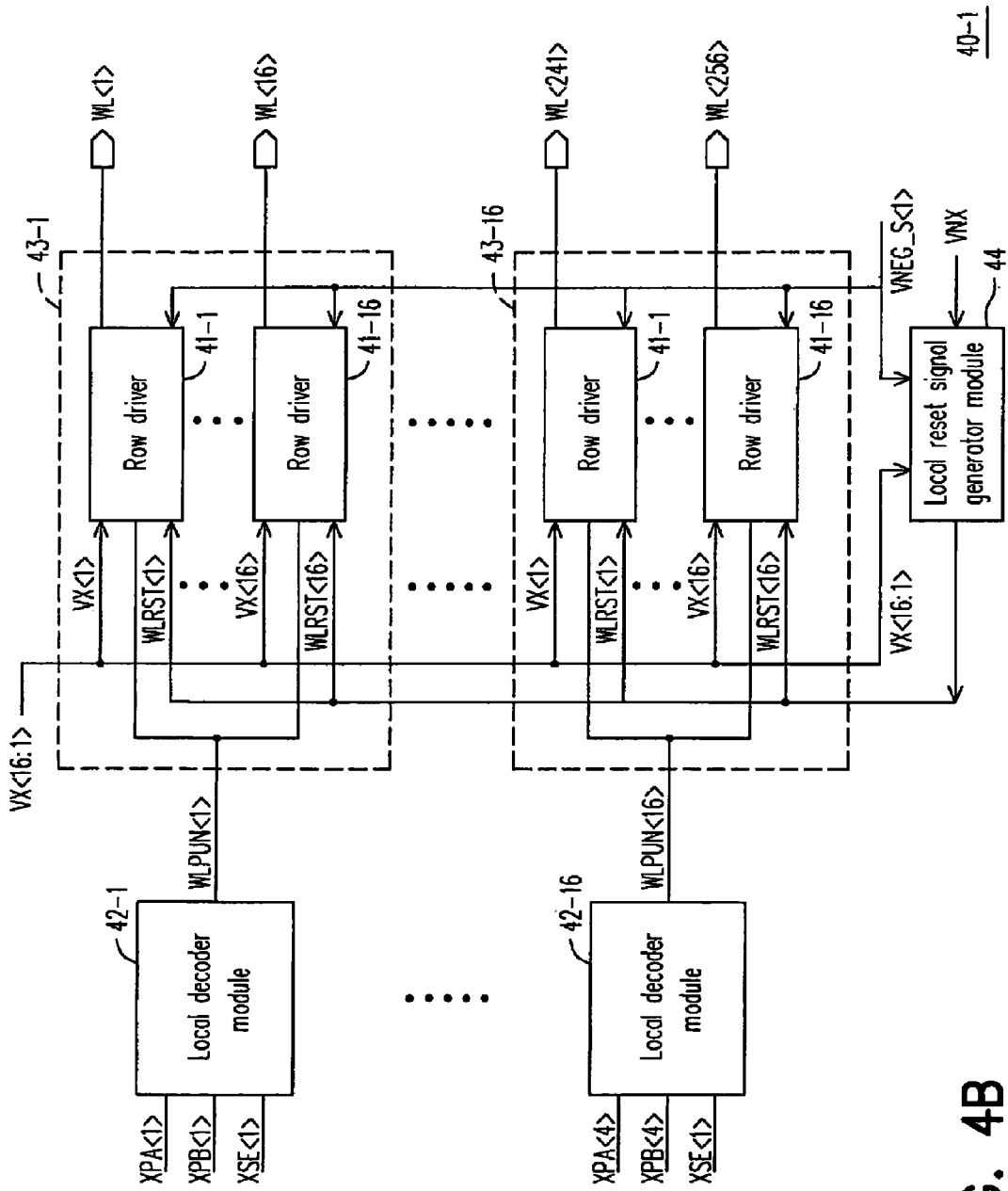
FIG. 4B is a block diagram showing the sector 40-1 of the word line driver circuit 40.

The structures of the sectors 40-1, 40-2, . . . , 40-16 of the word line driver circuit 40 are the same. Please see FIG. 4B, FIG. 4B is a block diagram showing the sector 40-1 of the word line driver circuit 40. The sector 40-1 of a word line driver circuit 40 comprises a local reset signal generator module 44, 16 local decoder modules 42-1, 42-2, . . . , 42-16 and 16 word line clusters 43-1, 43-2, . . . , 43-16. Wherein, the word line cluster 43-$k$ is composed of 16 row drivers 41-1~41-16, and k is an integer from 1 to 16. The 16 word line clusters 43-1, 43-2, . . . , 43-16 are coupled to the local reset signal generator module 44. The local decoder modules 42-1, 42-2, . . . , 42-16 are coupled to the word line clusters 43-1, 43-2, . . . , 43-16 respectively.

The local reset signal generator module 44 is used to generate 16 reset signals WLRST<16:1>. The reset signal WLRST<x> is coupled to the row driver 41-$x$, and the pre-decoding signal VX<x> is also coupled to the row driver 41-$x$. Wherein, x is an integer from 1 to 16.

Each of the 16 word line clusters comprises 16 row drivers 41-1, 41-2, . . . , 41-16. The x-th row driver 41-$x$ of the y-th word line cluster 43-$y$ determines the [x+16*(y−1)]-th word line signal WL<x+16*(y−1)> according to the x-th reset signal WLRST<x>, the pre-decoding signal VX<x>, the sector selectable signal VNEG_S<1>, and a y-th cluster select signal WLPUN<y>, wherein y is an integer from 1 to 16.

The y-th local decoder module 42-$y$ determines the y-th cluster select signal WLPUN<y> according to a sector select signal XSE<1>, the plurality of pre-decoding signals XPA<u>, and XPB<v>, wherein u and v are corresponding to y. For example, in this embodiment the first local decoder module 42-1 determines the first cluster select signal WLPUN<1> according to a sector select signal XSE<1>, the plurality of pre-decoding signals XPA<1> and XPB<1>; and the 16-th local decoder module 42-16 determines the 16th cluster select signal WLPUN<16> according to a sector select signal XSE<1>, the plurality of pre-decoding signals XPA<4> and XPB<4>.

The whole description of the sector 40-1 of the word line driver circuit 40 is stated above. However, this embodiment does not intend to limit the scope of the invention. The number of the word line clusters, the number of the row drivers in the word line cluster, and the number of the local decoder modules are determined by the user's discretion or the requirement of the application.

Figure 5:
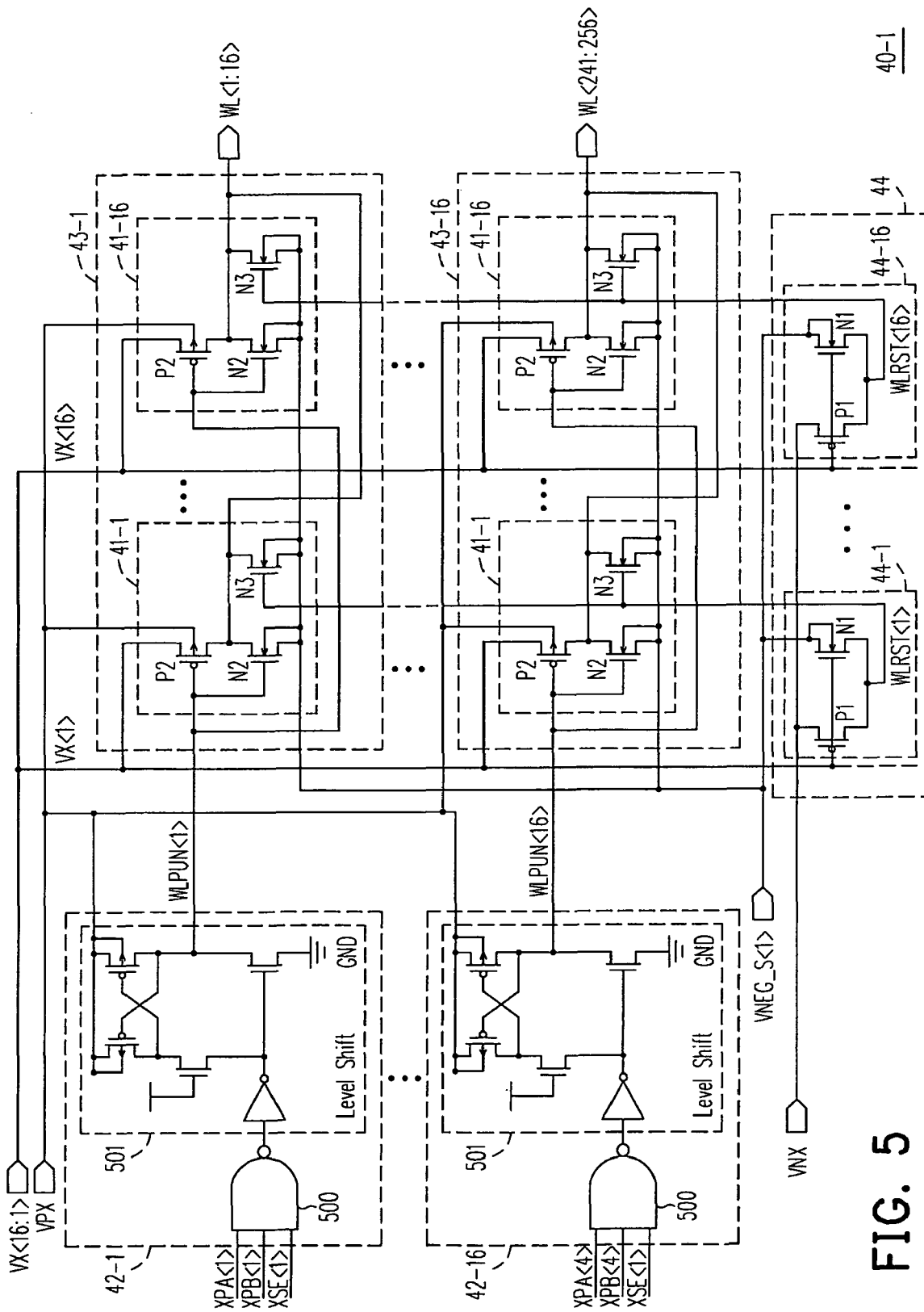
FIG. 5 is a detailed circuit diagram showing the sector 40-1 of the word line driver circuit 40.

Now, please see FIG. 5, FIG. 5 is a detailed circuit diagram showing the sector 40-1 of the word line driver circuit 40. In this embodiment, the y-th local decoder module 42-$y$ comprises a logic NAND gate 500 and a level shifter 501. The logic NAND gate 500 is used to receive the sector select signal XSE<1>, the pre-decoding signals XPA<u> and XPB<v>. The level shifter 501 is used to receive an output of the logic NAND gate 500 and outputting the y-th cluster select signal WLPUN<y>.

The local reset signal generator module 44 comprises 16 reset signal generating units 44-1, 44-2, . . . , 44-16. The x-th reset signal generating unit 44-$x$ is used to generate the x-th reset signal WLRST<x> according to the pre-decoding signal VX<x>, the bank selectable signal VNX and the sector selectable signal VNEG_S<1>.

In this embodiment, the x-th reset signal generating unit 44-*x* comprises a first PMOS transistor P1 and a first NMOS transistor N1. A gate of the first PMOS transistor P1 is coupled to the pre-decoding signal VX<x>, and a source of the PMOS first transistor P1 is coupled to the bank selectable signal VNX. A gate of the first NMOS transistor N1 is coupled to the pre-decoding signal VX<x>, and a drain of the first NMOS transistor N1 is coupled to the sector selectable signal VNEG_S<1>. A source of the first NMOS transistor N1 is coupled to a drain of the first PMOS transistor P1, and the x-th reset signal WLRST<x>.

In this embodiment, the x-th row driver 41-*x* of the y-th word line cluster 43-*y* comprises a second PMOS transistor P2, a second NMOS transistor N2, and a third NMOS transistor N3. A gate of the second PMOS transistor P2 is coupled to the y-th cluster select signal WLPUN<y>, a source of the second PMOS transistor P2 is coupled to the pre-decoding signal VX<1>, and a drain of the second PMOS transistor P2 is coupled to the [x+16*(y−1)]-th word line signal WL<x+16*(y−1)>. A gate of the second NMOS transistor N2 is coupled to the y-th cluster select signal WLPUN<y>, a source of the second NMOS transistor N2 is coupled to the sector selectable signal VNEG_S<1>, and a drain of the second NMOS transistor N2 is coupled to the drain of the second PMOS transistor P2. A gate of the third NMOS transistor N3 is coupled to the x-th reset signal WLRST<x>, a source of the third NMOS transistor N3 is coupled to the sector selectable signal VNEG_S<1>, and a drain of the third NMOS transistor N3 is coupled to the drain of the second PMOS transistor P2.

Figure 6A:
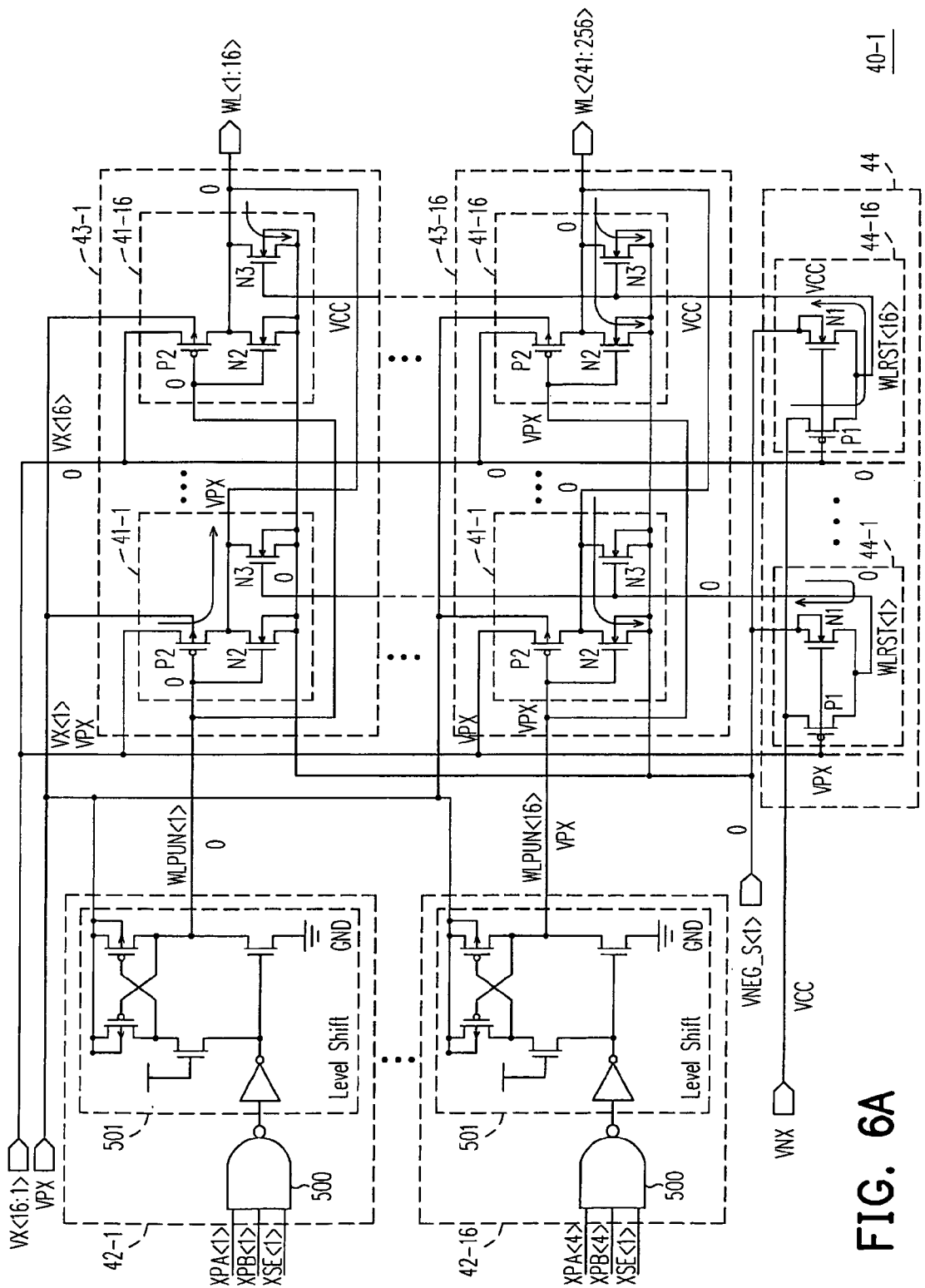
FIG. 6A is a schematic diagram showing the sector 40-1 of the word line driver circuit 40 operating in Program-or-Read mode.

In general, the word line driver circuit operate in one of the three modes, Program-or-Read mode, Erase mode, and Erase-Verify mode. Referring to FIG. 6A, FIG. 6A is a schematic diagram showing the sector 40-1 of the word line driver circuit 40 operating in Program-or-Read mode. In Program-or-Read mode, the bank selectable signal VNX is high (i.e. VCC), the power supply VPX is high (i.e. VPX is the highest voltage in the circuit system, and VPX is 8.5V in Program Mode and 5V in Read Mode.), and the sector selectable signal VNEG_S<1> is low (i.e. ground). In this embodiment, the word line signal WL<1> is designated to be selected, thus the first cluster select signal WLPUN<1> is low, and the other cluster select signals WLPUN<2>~WLPUN<16> are high (i.e. VPX). Further, the pre-decoding signal VX<1> must be high (i.e. VPX), and the other pre-decoding signals VX<2>~VX<16> must be low (i.e. ground).

In the condition of the embodiment as stated above, the PMOS transistor P1 of the reset signal generating unit 44-1 turns off, and the PMOS transistors P1 of the other reset signal generating unit 44-2, . . . , 44-16 turn on. The NMOS transistor N1 of the reset signal generating unit 44-1 turns on, and the NMOS transistors N1 of the other reset signal generating unit 44-2, . . . , 44-16 turn off. Thus the first reset signal WLRST<1> is low (i.e. ground), and the other reset signals WLRST<2>~WLRST<16> is high (i.e. VCC).

The word line cluster 43-1 is selected, while the other word line clusters 43-2, . . . , 43-16 are deselected. In the row driver 41-1 of the word line cluster 43-1, the PMOS transistor P2 turns on, the NMOS transistors N2 and N3 turn off, and thus the word line signal WL<1> is high (i.e. VPX). In the row drivers 41-2, . . . , 41-16 of the word line cluster 43-1, the NMOS transistor N3 turns on, the PMOS transistor P2 and the NMOS transistor N3 turn off, and thus the word line signal WL<2>~WL<16> is pulled down to the low level (i.e. ground).

In the row drivers 41-1 of the word line clusters 43-2, . . . , 43-16, only the NMOS transistors N2 turn on, and in the row drivers 41-2, . . . , 41-16 of the word line clusters 43-2, . . . , 43-16, only the NMOS transistors N2 and N3 turn on. Thus the word line signals WL<17>~WL<256> are low (i.e. ground).

Accordingly, a general relation of the signals can be deduced by the above statement. Referring to FIG. 6B, FIG. 6B is a table showing a general relation of the signals when the sector 40-1 of the word line driver circuit 40 operates in Program-or-Read mode. The other conditions of the sector 40-1 of the word line driver circuit 40 operating in Program-or-Read mode can be obtained by the table of FIG. 6B.

After describing the word line driver circuit 40 operating in Program-or-Read mode, a description of the word line driver circuit 40 operating in Erase mode is stated as follows. For example, in Erase mode, the condition that the sector 40-1 of the word line driver circuit 40 is selected, while the others are not. For the unselected sectors 40-2, . . . , 40-16 of the word line driver circuit 40 (XSE<K>=0, K is an integer from 2 to 16), all cluster select signals therein are high (i.e. VCC), and sector selectable signals and all select signals therein are low (i.e. ground). Thus, all word line signals therein are low (i.e. ground) when WLPUN is high.

Figure 7A:
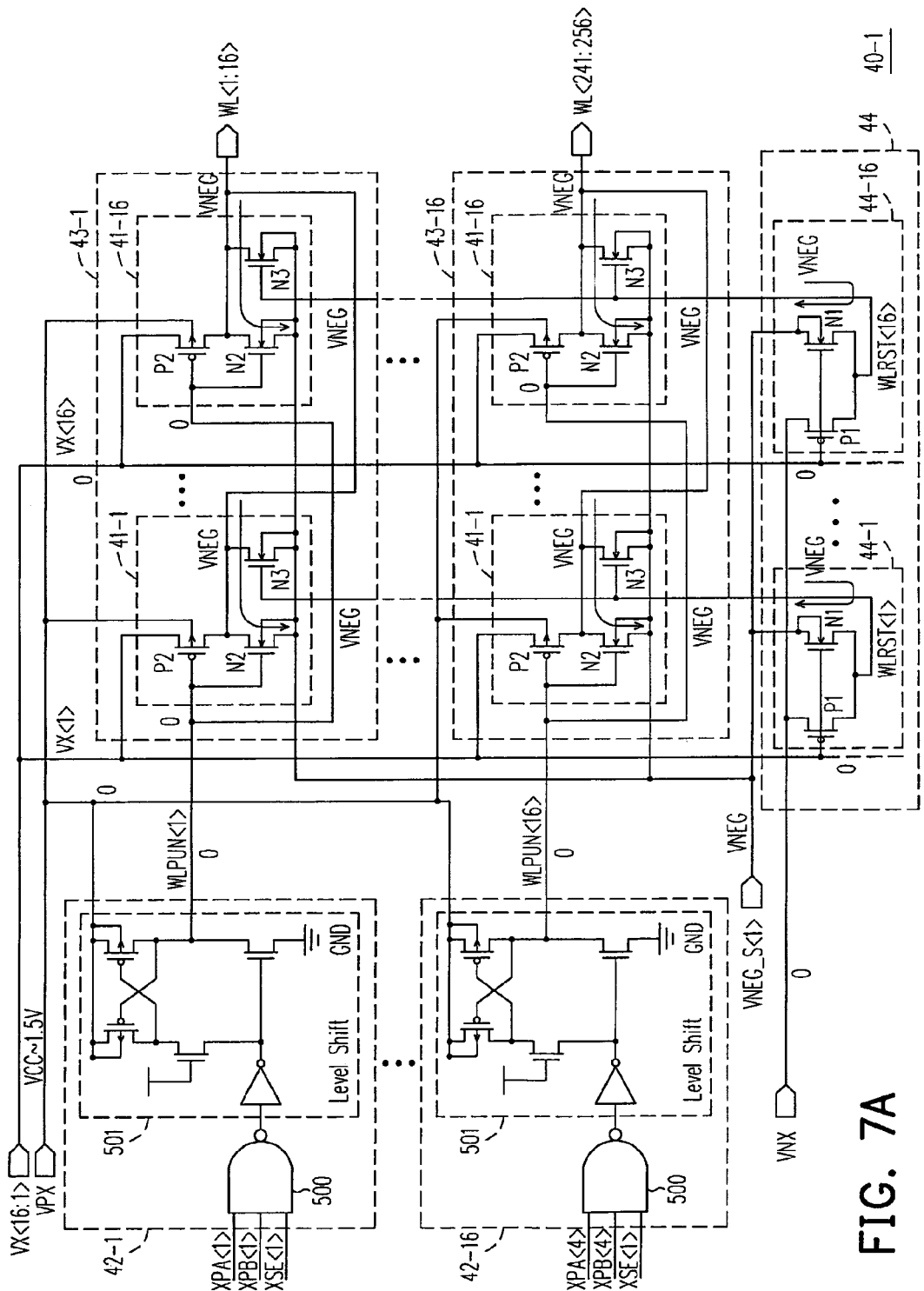
FIG. 7A is a schematic diagram showing the selected sector 40-1 of the word line driver circuit 40 operating in Erase mode.

Referring to FIG. 7A, FIG. 7A is a schematic diagram showing the selected sector 40-1 of the word line driver circuit 40 operating in Erase mode. In Erase mode, for the selected sector 40-1 of the word line driver circuit 40, the bank selectable signal VNX is low (i.e. ground), the power supply VPX is high (i.e., about 1.5 Volt), and the sector selectable signal VNEG_S<1> is negative. In Erase mode, all word line clusters 43-1, 43-2, . . . , 43-16 of the selected sector 40-1 are selected, and thus all cluster select signals WLPUN<1>~WLPUN<16> are low (i.e. ground).

In the condition of the embodiment as stated above, only all the NMOS transistors N1 and N2 of the sector 40-1 turn on, thus the reset signals WLRST<1>~WLRST<16> is negative, and the word line signals WL<1>~WL<256> are negative. Accordingly, a general relation of the signals can be deduced by the above statement. Referring to FIG. 7B, FIG. 7B is a table showing a general relation of the signals when the word line driver circuit 40 operates in Erase mode. All conditions of the word line driver circuit 40 operating in Erase mode can be obtained by the table of FIG. 7B.

Figure 8A:
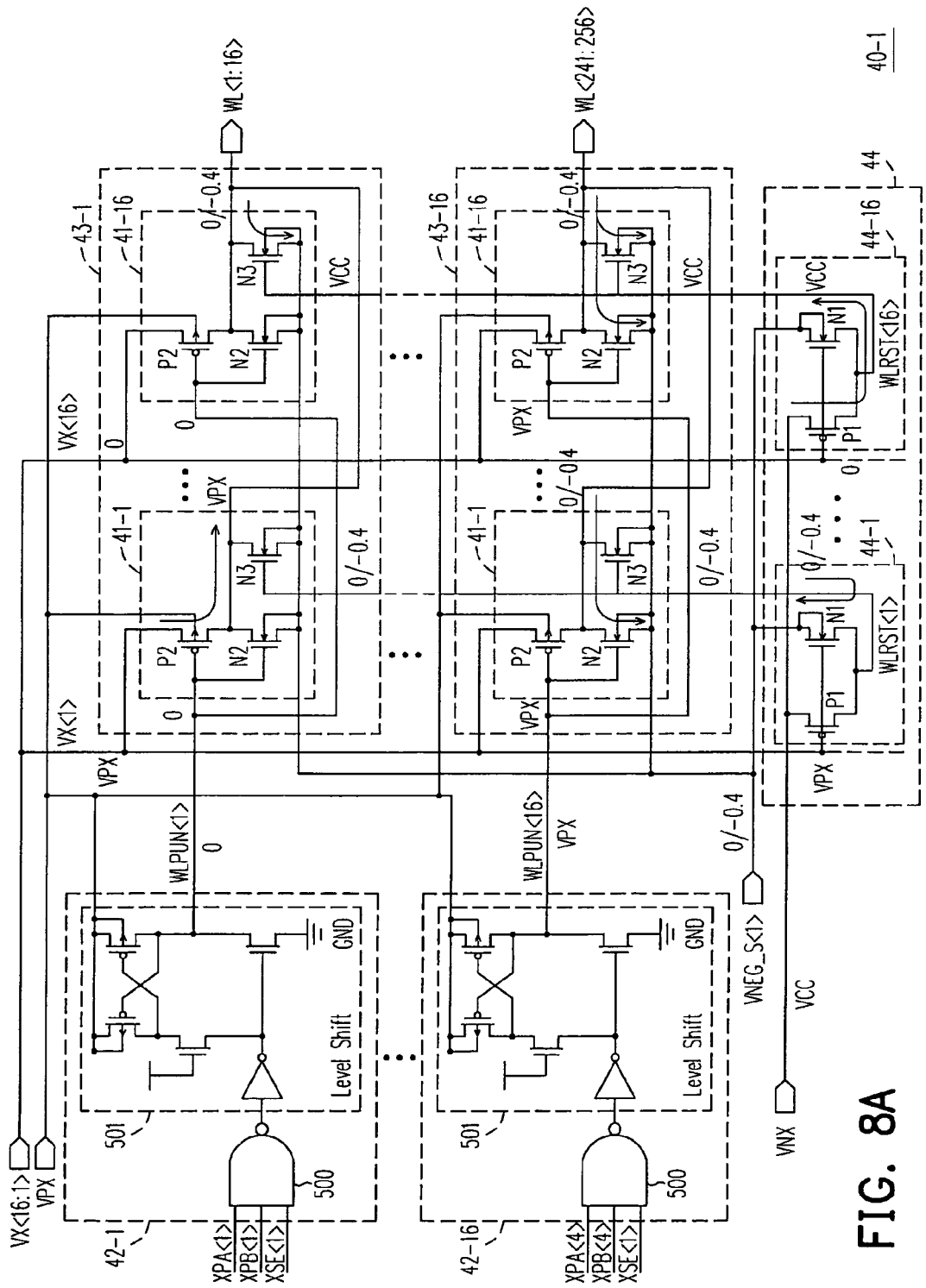
FIG. 8A is a schematic diagram showing the sector 40-1 of the word line driver circuit 40 operating in Erase-Verify mode.

Referring to FIG. 8A, FIG. 8A is a schematic diagram showing the sector 40-1 of the word line driver circuit 40 operating in Erase-Verify mode. The sector 40-1 of the word line driver circuit 40 operating in Erase-Verify is similar with the sector 40-1 of the word line driver circuit 40 operating in Program-or-Read mode. The difference is the low level of the sector selectable signal VNEG_S<1> can be ground or −0.4 Volt. If the low level of the sector selectable signal VNEG_S<1> is −0.4 Volt, the low levels of the word line signals WL<2>~WL<256> and the reset signal WLRST<1> are −0.4 Volt.

Accordingly, a general relation of the signals can be deduced by the above statement. Referring to FIG. 8B, FIG. 8B is a table showing a general relation of the signals when the sector 40-1 of the word line driver circuit 40 operates in Erase-Verify mode. The other conditions of the sector 40-1 of the word line driver circuit 40 operating in Erase-Verify mode can be obtained by the table of FIG. 8B.

The word line driver circuit provided by the embodiment of the present invention has a local reset signal generator module for each sector, thus the power efficiency performs better than the conventional word line driver circuit. While manufacturing the word line driver circuit provided by the embodiment of the present invention in 90 nano-meter process, utilizing the die area of each sector to dispose the local reset signal generator module in each sector will make the die area efficiency higher than that of the conventional word line driver circuit.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A sector of a word line driver circuit, comprising:
   a local reset signal generator module, for generating j reset signals, the x-th reset signal is determined according to an x-th pre-decoding signal, a bank selectable signal and a sector selectable signal, wherein j is a nature number, and x is an integer from 1 to j; and
   m word line clusters, coupled to the local reset signal generator module, each of the m word line clusters comprises j row drivers, the x-th row driver of the y-th word line cluster determines a [x+j*(y−1)]-th word line signal according to the x-th reset signal, the x-th pre-decoding signal, the sector selectable signal, and a y-th cluster select signal, wherein m is a nature number, and y is an integer from 1 to m;
   wherein the x-th row driver of the y-th word line cluster comprises:
      a second PMOS transistor, a gate of the second PMOS transistor is coupled to the y-th cluster select signal, a source of the second PMOS transistor is coupled to the x-th pre-decoding signal, a drain of the second PMOS transistor is coupled to the [x+j*(y−1)]-th word line signal;
      a second NMOS transistor, a gate of the second NMOS transistor is coupled to the y-th cluster select signal, a source of the second NMOS transistor is coupled to the sector selectable signal, a drain of the second NMOS transistor is coupled to the drain of the second PMOS transistor; and
      a third NMOS transistor, a gate of the third NMOS transistor is coupled to the x-th reset signal, a source of the third NMOS transistor is coupled to the sector selectable signal, a drain of the third NMOS transistor is coupled to the drain of the second PMOS transistor.

2. The sector of word line driver circuit according to claim 1, wherein the local reset signal generator module comprises j reset signal generating units, the x-th reset signal generating unit is used to generate the x-th reset signal according to the x-th pre-decoding signal, the bank selectable signal and the sector selectable signal.

3. The sector of word line driver circuit according to claim 2, wherein the x-th reset signal generating unit comprises:
   a first PMOS transistor, a gate of the first PMOS transistor is coupled to the x-th pre-decoding signal, a source of the PMOS first transistor is coupled to the bank selectable signal; and
   a first NMOS transistor, a gate of the first NMOS transistor is coupled to the bank selectable signal, a drain of the first NMOS transistor is coupled to the sector selectable signal, a source of the first NMOS transistor is coupled to a drain of the first PMOS transistor, and the x-th reset signal.

4. The sector of word line driver circuit according to claim 1, further comprising:
   m local decoder modules, coupled to the m word line clusters respectively, the y-th local decoder module determines the y-th cluster select signal according to a sector select signal, a plurality of pre-decoding signals XPA<u>, and XPB<v>, wherein u and v are corresponding to y.

5. The sector of word line driver circuit according to claim 4, wherein the y-th local decoder module comprises:
   a logic NAND gate, for receiving the sector select signal, the pre-decoding signals XPA<u>, and XPB<v>; and
   a level shifter, for receiving an output of the logic NAND gate and outputting the y-th cluster select signal.

6. The sector of word line driver circuit according to claim 1, wherein the [x+j*(y−1)]-th word line signal is high and the x-th reset signal is low when the bank selectable signal is high, the sector selectable signal is low, the x-th pre-decoding signal is high, and y-th cluster select signal is low; and wherein the [x+j*(y−1)]-th word line signal is low and the x-th reset signal is high when the bank selectable signal is high, the sector selectable signal is low, the x-th pre-decoding signal is low, and y-th cluster select signal is low.

7. The sector of word line driver circuit according to claim 1, wherein the [x+j*(y−1)]-th word line signal is low and the x-th reset signal is low when the bank selectable signal is high, the sector selectable signal is low, the x-th pre-decoding signal is high, and y-th cluster select signal is high; and wherein the [x+j*(y−1)]-th word line signal is low and the x-th reset signal is high when the bank selectable signal is high, the sector selectable signal is low, the x-th pre-decoding signal is low, and y-th cluster select signal is high.

8. The sector of word line driver circuit according to claim 1, wherein the [x+j*(y−1)]-th word line signal is negative and the x-th reset signal is negative when the bank selectable signal is low, the sector selectable signal is negative, the x-th pre-decoding signal is low, and y-th cluster select signal is low; and wherein the [x+j*(y−1)]-th word line signal is low and the x-th reset signal is floating when the bank selectable signal is high, the sector selectable signal is low, the x-th pre-decoding signal is high, and y-th cluster select signal is high.

9. A word line driver circuit, comprising:
   i sectors of the word line driver circuit, wherein i is a nature number, the k-th sector of the word line driver circuit comprises:
      a local reset signal generator module, for generating j reset signals, the x-th reset signal is determined according to a x-th pre-decoding signal, a bank selectable signal and a k-th sector selectable signal, wherein j is a nature number, and x is an integer from 1 to j; and
      m word line clusters, coupled to the local reset signal generator module, each of the m word line clusters comprises j row drivers, the x-th row driver of the y-th word line cluster determines a [x+j*(y−1)+(k−1)*m*j]-th word line signal according to the x-th reset signal, the x-th pre-decoding signal, the k-th sector selectable signal, and a y-th cluster select signal, wherein y is an integer from 1 to m;
      wherein k is an integer from 1 to i, and the x-th row driver of the y-th word line cluster comprises:
         a second PMOS transistor, a gate of the second PMOS transistor is coupled to the y-th cluster select signal, a source of the second PMOS transistor is coupled to the x-th pre-decoding signal, a drain of the second PMOS transistor is coupled to the [x+j*(y−1)+(k−1)*m*j]-th word line signal;
         a second NMOS transistor, a gate of the second NMOS transistor is coupled to the y-th cluster select signal, a source of the second NMOS transistor is coupled to the k-th sector selectable signal, a drain of the second NMOS transistor is coupled to the drain of the second PMOS transistor; and a third NMOS transistor, a gate of the third NMOS transistor is coupled to the x-th reset signal, a source of the third NMOS transistor is coupled to the k-th sector selectable signal, a drain of the third NMOS transistor is coupled to the drain of the second PMOS transistor.

10. The word line driver circuit according to claim 9, wherein the local reset signal generator module comprises j reset signal generating units, the x-th reset signal generating unit is used to generate the x-th reset signal according to the x-th pre-decoding signal, the bank selectable signal and the k-th sector selectable signal.

11. The word line driver circuit according to claim 10, wherein the x-th reset signal generating unit comprises:

a first PMOS transistor, a gate of the first PMOS transistor is coupled to the x-th pre-decoding signal, a source of the PMOS first transistor is coupled to the bank selectable signal; and a first NMOS transistor, a gate of the first NMOS transistor is coupled to the bank selectable signal, a drain of the first NMOS transistor is coupled to the k-th sector selectable signal, a source of the first NMOS transistor is coupled to a drain of the first PMOS transistor, and the x-th reset signal.

12. The word line driver circuit according to claim 9, wherein the k-th sector of the word line driver circuit further comprises:

m local decoder modules, coupled to the m word line clusters respectively, the y-th local decoder module determines the y-th cluster select signal according to a k-th sector select signal, a plurality of pre-decoding signals XPA<u>, and XPB<v>, wherein u and v are corresponding to y.

13. The word line driver circuit according to claim 12, wherein the y-th local decoder module comprises:

a logic NAND gate, for receiving the k-th sector select signal, the pre-decoding signals XPA<u>, and XPB<v>; and a level shifter, for receiving an output of the logic NAND gate and outputting the y-th cluster select signal.

14. The word line driver circuit according to claim 9, wherein the [x+j*(y−1)+(k−1)*m*j]-th word line signal is high and the x-th reset signal is low when the bank selectable signal is high, the k-th sector selectable signal is low, the x-th pre-decoding signal is high, and y-th cluster select signal is low; and wherein the [x+j*(y−1)+(k−1)*m*j]-th word line signal is low and the x-th reset signal is high when the bank selectable signal is high, the k-th sector selectable signal is low, the x-th pre-decoding signal is low, and y-th cluster select signal is low.

15. The word line driver circuit according to claim 9, wherein the [x+j*(y−1)+(k−1)*m*j]-th word line signal is low and the x-th reset signal is low when the bank selectable signal is high, the k-th sector selectable signal is low, the x-th pre-decoding signal is high, and y-th cluster select signal is high; and wherein the [x+j*(y−1)+(k−1)*m*j]-th word line signal is low and the x-th reset signal is high when the bank selectable signal is high, the k-th sector selectable signal is low, the x-th pre-decoding signal is low, and y-th cluster select signal is high.

16. The word line driver circuit according to claim 9, wherein the [x+j*(y−1)+(k−1)*m*j]-th word line signal is negative and the x-th reset signal is negative when the bank selectable signal is low, the k-th sector selectable signal is negative, the x-th pre-decoding signal is low, and y-th cluster select signal is low; and wherein the [x+j*(y−1)+(k−1)*m*j]-th word line signal is low and the x-th reset signal is floating when the bank selectable signal is high, the k-th sector selectable signal is low, the x-th pre-decoding signal is high, and y-th cluster select signal is high.

* * * * *